(12) United States Patent
Kimura et al.

(10) Patent No.: US 9,087,974 B2
(45) Date of Patent: Jul. 21, 2015

(54) SEMICONDUCTOR LIGHT EMITTING DEVICE AND METHOD FOR MANUFACTURING THE SAME

(71) Applicant: KABUSHIKI KAISHA TOSHIBA, Minato-ku (JP)

(72) Inventors: Akiya Kimura, Kanagawa-ken (JP); Kazuhito Higuchi, Kanagawa-ken (JP); Kazuo Shimokawa, Kanagawa-ken (JP); Susumu Obata, Kanagawa-ken (JP); Toshiya Nakayama, Kanagawa-ken (JP); Hisashi Ito, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/492,917

(22) Filed: Sep. 22, 2014

(65) Prior Publication Data

US 2015/0008469 A1    Jan. 8, 2015

Related U.S. Application Data

(62) Division of application No. 13/826,509, filed on Mar. 14, 2013, now Pat. No. 8,916,901.

(30) Foreign Application Priority Data

Mar. 23, 2012  (JP) ................................ 2012-068462

(51) Int. Cl.
*H01L 33/00* (2010.01)
*H01L 33/62* (2010.01)
(Continued)

(52) U.S. Cl.
CPC .............. *H01L 33/62* (2013.01); *H01L 25/167* (2013.01); *H01L 33/0075* (2013.01);
(Continued)

(58) Field of Classification Search
CPC .......... H01L 21/00; H01L 33/00; H01L 29/00
USPC ....................................... 257/99, 98, E33.066
See application file for complete search history.

(56) References Cited

U.S. PATENT DOCUMENTS

2006/0091409 A1   5/2006  Epler et al.
2009/0001869 A1   1/2009  Tanimoto et al.
(Continued)

FOREIGN PATENT DOCUMENTS

CN          102024836 A     4/2011
CN          102270727 A     12/2011
(Continued)

OTHER PUBLICATIONS

Combined Taiwanese Office Action and Search Report issued Dec. 23, 2015 in Patent Application No. 102107085 (with English Translation).

(Continued)

*Primary Examiner* — Telly Green
(74) *Attorney, Agent, or Firm* — Oblon, McClelland, Maier & Neustadt, L.L.P.

(57) ABSTRACT

A semiconductor light emitting device includes a light emitting unit, a first and second conductive pillar, a sealing unit, and a first and second terminal. The light emitting unit includes a first and second semiconductor layer and a light emitting layer. The light emitting layer is provided on the first semiconductor layer. The second semiconductor layer is provided on the light emitting layer. The first conductive pillar is provided on the first semiconductor layer. The second conductive pillar is provided on the second semiconductor layer. The sealing unit covers side faces of each of the light emitting unit, the first conductive pillar, and the second conductive pillar. The first terminal is provided on the first conductive pillar and on the sealing unit. The second terminal is provided on the second conductive pillar and on the sealing unit.

11 Claims, 9 Drawing Sheets

(51) Int. Cl.
*H01L 25/16* (2006.01)
*H01L 33/48* (2010.01)
*H01L 33/64* (2010.01)

(52) U.S. Cl.
CPC ......... *H01L 33/486* (2013.01); *H01L 33/647* (2013.01); *H01L 2224/16245* (2013.01); *H01L 2933/0033* (2013.01); *H01L 2933/0066* (2013.01)

(56) References Cited

U.S. PATENT DOCUMENTS

| | | |
|---|---|---|
| 2010/0140640 A1 | 6/2010 | Shimokawa et al. |
| 2011/0062891 A1 | 3/2011 | Chen et al. |
| 2011/0073889 A1 | 3/2011 | Sugizaki et al. |
| 2011/0297969 A1 | 12/2011 | Kojima et al. |
| 2011/0297985 A1 | 12/2011 | Naka |
| 2011/0297986 A1 | 12/2011 | Nishiuchi et al. |
| 2011/0297998 A1 | 12/2011 | Akimoto et al. |
| 2011/0300644 A1 | 12/2011 | Akimoto et al. |
| 2012/0199861 A1 | 8/2012 | Tsuji |
| 2012/0241792 A1 | 9/2012 | Obata et al. |
| 2013/0015483 A1 | 1/2013 | Shimokawa et al. |
| 2013/0069102 A1 | 3/2013 | Kimura et al. |
| 2013/0082294 A1 | 4/2013 | Nakayama et al. |
| 2013/0087823 A1 | 4/2013 | Tsai et al. |

FOREIGN PATENT DOCUMENTS

| | | |
|---|---|---|
| JP | 2004-96113 A | 3/2004 |
| JP | 2006-128710 A | 5/2006 |
| JP | 2007-129188 A | 5/2007 |
| JP | 2007-258466 | 10/2007 |
| JP | 2008-85113 | 4/2008 |
| JP | 2008-130723 | 6/2008 |
| JP | 2010-130526 A | 6/2010 |
| JP | 2010-232643 | 10/2010 |
| JP | 2010-251807 | 11/2010 |
| JP | 2011-71272 | 4/2011 |
| JP | 2011-181655 | 9/2011 |
| JP | 2011-228380 | 11/2011 |
| JP | 2011-253999 | 12/2011 |
| JP | 2011-258667 | 12/2011 |
| JP | 2012-44205 | 3/2012 |
| JP | 2013-65773 A | 4/2013 |
| JP | 2013-201156 A | 10/2013 |
| JP | 2013-247301 | 12/2013 |
| KR | 10-2011-0028236 | 3/2011 |
| TW | 200640045 | 11/2006 |
| TW | 201104914 A1 | 2/2011 |
| TW | 201110410 A1 | 3/2011 |
| TW | 201112455 A1 | 4/2011 |
| TW | 201203630 A1 | 1/2012 |
| WO | WO 2011/093454 A1 | 8/2011 |

OTHER PUBLICATIONS

Akiya Kimura et al., "Optical Characteristics and Reliability Evaluation of Wafer Level White LED Package", Electronic Components and Technology Conference (ECTC), 2012 IEEE $62^{nd}$, pp. 1394-1399.
Office Action issued Jan. 29, 2014 in Korean Patent Application No. 10-2013-24410 (with English translation).
Office Action mailed May 30, 2014 in Japanese Application No. 2012-068462 filed Mar. 23, 2012 (w/English translation).
Korean Office Action issued on Aug. 11, 2014, in Patent Application No. 10-2013-0024410 with English translation.
Office Action issued Jan. 30, 2014 in Japanese Application No. 2012-068462 (With English Translation).
Office Action issued Apr. 3, 2015 in Chinese Patent Application No. 201310123335.8 (with English translation).

SEMICONDUCTOR LIGHT EMITTING DEVICE AND METHOD FOR MANUFACTURING THE SAME

CROSS-REFERENCE TO RELATED APPLICATIONS

This divisional application claims the benefit of priority under 35 U.S.C. §120 from prior U.S. patent application Ser. No. 13/826,509, filed on Mar. 14, 2013. This application is also based upon and claims the benefit of priority under 35 U.S.C. §119 from prior Japanese Patent Application No. 2012-068462, filed on Mar. 23, 2012. The entire contents of each of these applications are incorporated herein by reference.

FIELD

Embodiments described herein relate generally to a semiconductor light emitting device and a method for manufacturing the same.

BACKGROUND

Semiconductor light emitting devices such as light emitting diodes (LEDs) and the like have been developed using nitride semiconductors. Also, semiconductor light emitting devices that emit white light have been developed by, for example, combining an LED that emits blue light and a phosphor that absorbs blue light and emits yellow light. In semiconductor light emitting devices of this type, increases in reliability are desired.

DETAILED DESCRIPTION

According to one embodiment, a semiconductor light emitting device includes a light emitting unit, a first conductive pillar, a second conductive pillar, a sealing unit, a first terminal, and a second terminal. The light emitting unit includes a first semiconductor layer, a light emitting layer, and a second semiconductor layer. The first semiconductor layer has a first conductivity type. The first semiconductor layer has a major surface including a first portion and a second portion. The light emitting layer is provided on the first portion. The second semiconductor layer has a second conductivity type. The second semiconductor layer is provided on the light emitting layer. The light emitting unit has a side face intersecting with the major surface. The first conductive pillar is provided on the second portion and extending along a first direction perpendicular to the major surface. The first conductive pillar has a side face along the first direction and is electrically connected to the first semiconductor layer. The second conductive pillar is provided on the second semiconductor layer and extending along the first direction. The second conductive pillar has a side face along the first direction and is electrically connected to the second semiconductor layer. The sealing unit covers the side face of the light emitting unit, the side face of the first conductive pillar, and the side face of the second conductive pillar. The first terminal is provided on the first conductive pillar and on the sealing unit, and is electrically connected to the first conductive pillar. The first terminal includes a first overlapping portion and a second overlapping portion. The first overlapping portion overlaps with the light emitting unit. The second overlapping portion does not overlap with the light emitting unit and overlaps with the sealing unit when projected onto a plane parallel to the major surface. The second terminal is provided on the second conductive pillar and on the sealing unit. The second terminal is apart from the first terminal and is electrically connected to the second conductive pillar. The second terminal includes a third overlapping portion and a fourth overlapping portion. The third overlapping portion overlaps with the light emitting unit. The fourth overlapping portion does not overlap with the light emitting unit and overlaps with the sealing unit when projected onto the plane.

According to another embodiment, a method is disclosed for manufacturing a semiconductor light emitting device. The method can include preparing a work piece including a support substrate and a plurality of semiconductor components arranged on a surface of the support substrate. Each of the semiconductor components includes a substrate unit, a light emitting unit, a first conductive pillar, and a second conductive pillar. The light emitting unit is provided on the substrate unit. The light emitting unit includes a first semiconductor layer, a light emitting layer, and a second semiconductor layer. The first semiconductor layer has a first conductivity type and provided on the substrate unit. The first semiconductor layer has a major surface including a first portion and a second portion. The light emitting layer is provided on the first portion. The second semiconductor layer has a second conductivity type and provided on the light emitting layer. The light emitting unit has a side face intersecting with the major surface. The first conductive pillar is provided on the second portion and extending along a first direction perpendicular to the major surface. The first conductive pillar has a side face along the first direction and is electrically connected to the first semiconductor layer. The second conductive pillar is provided on the second semiconductor layer and extending along the first direction. The second conductive pillar has a side face along the first direction and is electrically connected to the second semiconductor layer. The method can include forming a resin film on the semiconductor components and on the surface of the support substrate. The resin film covers the side face of the light emitting unit, the side face of the first conductive pillar, and the side face of the second conductive pillar of each of the semiconductor components. The method can include removing the support substrate from the semiconductor components and the resin film. The method can include forming a plurality of concave portions in the resin film. The concave portions is reflected the shape of the substrate units by removing each of the substrate units of the semiconductor components. The method can include forming a wavelength conversion layer including a wavelength conversion material by filling the plurality of concave portions with a resin material including the wavelength conversion material. The wavelength conversion layer absorbs at least a part of a first light being emitted from the light emitting unit, and emits a second light having a peak wavelength being different from the peak wavelength of the first light. The method can include cutting the resin film between pairs of the semiconductor components.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

First Embodiment

Figure 1:
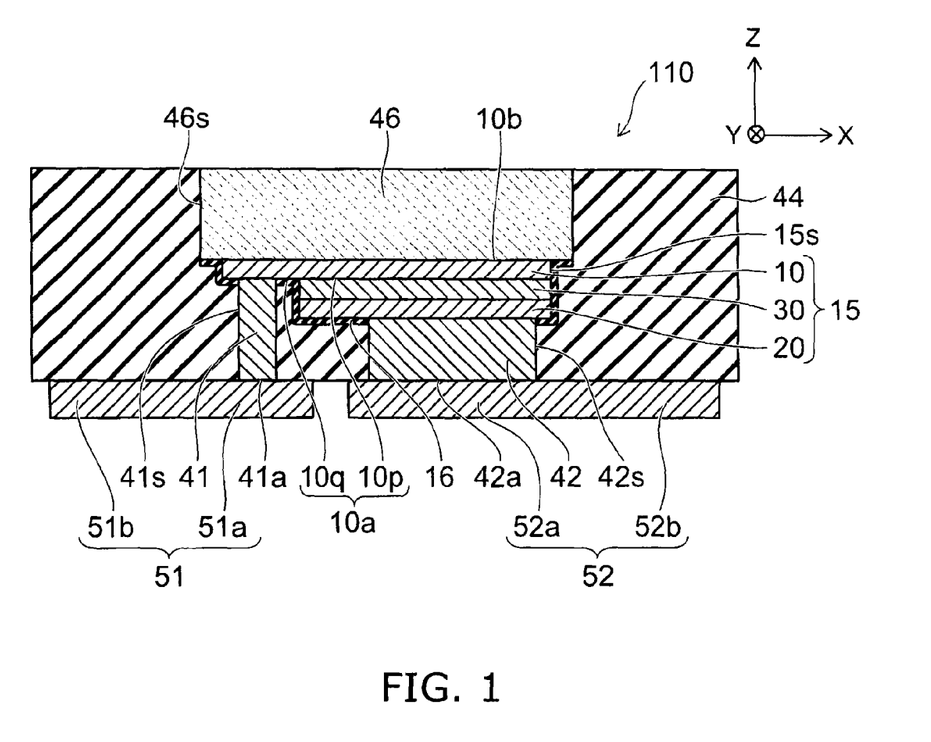
FIG. 1 is a schematic cross-sectional view illustrating a semiconductor light emitting device according to a first embodiment.

FIG. 1 is a schematic cross-sectional view illustrating a semiconductor light emitting device according to a first embodiment. As illustrated in FIG. 1, a semiconductor light emitting device 110 according to this embodiment includes a light emitting unit 15, a first conductive pillar 41, a second conductive pillar 42, a sealing unit 44, a first terminal 51, and a second terminal 52.

The light emitting unit 15 includes a first semiconductor layer 10, a second semiconductor layer 20, and a light emitting layer 30.

The first semiconductor layer 10 has a first major surface (major surface) 10a and a second major surface 10b on a side opposite the first major surface 10a. The second major surface 10b is, for example, substantially parallel to the first major surface 10a. The first semiconductor layer 10 has a first conductivity type. The first major surface 10a includes a first portion 10p opposing the second semiconductor layer 20 and a second portion 10q that is not opposing the second semiconductor layer 20. The first portion 10p is juxtaposed with the second portion 10q.

The light emitting layer 30 is provided on the first portion 10p of the first major surface 10a. The second semiconductor layer 20 is provided on the light emitting layer 30. The light emitting layer 30 is provided between the first semiconductor layer 10 and the second semiconductor layer 20. The second semiconductor layer 20 has a second conductivity type. The second conductivity type is a different conductivity type from the first conductivity type. For example, the first conductivity type is n-type and the second conductivity type is p-type. However, this embodiment is not limited thereto, and the first conductivity type may be p-type and the second conductivity type may be n-type. Hereafter, a case in which the first conductivity type is n-type, and the second conductivity type is p-type will be described.

The first semiconductor layer 10, the second semiconductor layer 20, and the light emitting layer 30 include nitride semiconductors, for example. The first semiconductor layer 10 includes an n-type clad layer, for example. The second semiconductor layer 20 includes a p-type clad layer, for example. The light emitting layer 30 has, for example, a single quantum well (SQW) structure, or a multi quantum well (MQW) structure.

The light emitting layer 30 with a single quantum well structure includes, for example, two barrier layers and a well layer provided between the two barrier layers. The light emitting layer 30 with a multi quantum well structure includes, for example, not less than three barrier layers and a well layer provided between each pair of the barrier layers. For the barrier layer, for example, a GaN compound semiconductor is used. For the well layer, for example, an InGaN compound semiconductor is used. When the barrier layer includes In, the composition ratio of In in the barrier layer is less than the composition ratio of In in the well layer.

For example, a stacked crystal film that will form the light emitting unit 15 is formed by crystal growth of the first semiconductor layer 10, the light emitting layer 30, and the second semiconductor layer 20 in that order on a substrate. A part of the stacked crystal film is removed from the second semiconductor layer 20 side until it reaches the first semiconductor layer 10. As a result, a part (the second portion 10q) of the first semiconductor layer 10 is exposed, and the light emitting layer 30 and the second semiconductor layer 20 remain on the first portion 10p. Thereby, the light emitting unit 15 is formed. The light emitting unit 15 has a side face 15s that intersects the first major surface 10a. The second portion 10q is juxtaposed with the first portion 10p in the X-Y plane. The light emitting unit 15 is apart from the substrate, for example, after crystal growth on the substrate.

Here, a first direction perpendicular to the first major surface 10a (the direction from the first semiconductor layer 10 to the second semiconductor layer 20) is taken to be the Z-axis direction. One direction perpendicular to the Z-axis direction (one direction parallel to the first major surface 10a) is taken to be the X-axis direction. The direction perpendicular to the Z-axis direction and the X-axis direction (one other direction perpendicular to the one direction and parallel to the first major surface 10a) is taken to be the Y-axis direction. The Z-axis direction does not have to be strictly perpendicular to the first major surface 10a.

The thickness of the first semiconductor layer 10 (the thickness along the Z-axis direction) is, for example, not less than 1 μm and not more than 10 μm. In this example, the thickness of the first semiconductor layer 10 is, for example, 5 μm. The thickness of the second semiconductor layer 20 is, for example, not less than 5 nm and not more than 300 nm. In this example, the thickness of the second semiconductor layer 20 is, for example, 100 nm. The thickness of the light emitting layer 30 is, for example, not less than 5 nm and not more than 100 nm. In this example, the thickness of the light emitting layer 30 is, for example, 10 nm.

The first conductive pillar 41 is provided on the second portion 10q. The first conductive pillar 41 extends along the Z-axis direction. The first conductive pillar 41 has a side face 41s that extends along the Z-axis direction. The first conductive pillar 41 has, for example, a circular prismatic or a rectangular prismatic shape. The first conductive pillar 41 is electrically connected to the first semiconductor layer 10. The first conductive pillar 41, for example, contacts the second portion 10q and is electrically continuous with the first semiconductor layer 10. An electrically conductive member such as an electrode or the like may be provided between the first semiconductor layer 10 and the first conductive pillar 41.

The second conductive pillar 42 is provided on the second semiconductor layer 20. The second conductive pillar 42 extends along the Z-axis direction. The second conductive pillar 42 has a side face 42s that extends along the Z-axis direction. The second conductive pillar 42 has, for example, a circular prismatic or a rectangular prismatic shape. The second conductive pillar 42 is electrically connected to the second semiconductor layer 20. The second conductive pillar 42, for example, contacts the second semiconductor layer 20 and is electrically continuous with the second semiconductor layer 20. An electrically conductive member such as an electrode or the like may be provided between the second semiconductor layer 20 and the second conductive pillar 42.

A material having electrical conductivity is used in the first conductive pillar 41 and the second conductive pillar 42. A metal material such as copper or the like, for example, is used in the first conductive pillar 41 and the second conductive pillar 42. The number of the first conductive pillar 41 and the second conductive pillar 42 is not limited to one, but may be a plurality.

The sealing unit 44 covers the side face 15s of the light emitting unit 15, the side face 41s of the first conductive pillar 41, and the side face 42s of the second conductive pillar 42. The sealing unit 44 allows an end portion 41a of the first conductive pillar 41 and an end portion 42a of the second conductive pillar 42 to be exposed. Of the two end portions of the prismatic first conductive pillar 41, the end portion 41a is on the opposite side to the side in contact with the first semiconductor layer 10. Of the two end portions of the prismatic second conductive pillar 42, the end portion 42a is on the opposite side to the side in contact with the second semiconductor layer 20. In this way, the sealing unit 44 retains the light emitting unit 15, the first conductive pillar 41, and the second conductive pillar 42. For example, the sealing unit 44 protects the light emitting unit 15, the first conductive pillar 41, and the second conductive pillar 42. An insulating resin such as epoxy resin or the like is used in the sealing unit 44. The sealing unit 44 can include, for example, a quartz filler, an alumina filler or the like. As a result, the thermal conductivity of the sealing unit 44 is increased, and heat dissipation can be increased.

A wavelength conversion layer 46 is provided on the second major surface 10b of the first semiconductor layer 10. In other words, the first semiconductor layer 10 is provided on the wavelength conversion layer 46. The wavelength conversion layer 46 covers, for example, the light emitting unit 15 on the upper side of the second major surface 10b. The wavelength conversion layer 46 has a side face 46s that intersects the first major surface 10a. The wavelength conversion layer 46 absorbs, for example, at least a part of the luminescent light (first light) of the light emitting unit 15, and emits light (second light) whose peak wavelength is different from the peak wavelength of the luminescent light. In other words, the wavelength conversion layer 46 converts the peak wavelength of the light emitted from the light emitting unit 15. The wavelength conversion layer 46 may emit, for example, light with a plurality of peak wavelengths that is different from the peak wavelength of the luminescent light. In this example, the sealing unit 44 further covers the side face 46s of the wavelength conversion layer 46. The sealing unit 44 also retains the wavelength conversion layer 46.

For the wavelength conversion layer 46, a phosphor layer may, for example, be used. The phosphor layer may be formed by, for example, thermosetting a liquid transparent resin in which phosphor particles have been dispersed. A material that has transmittivity with respect to the luminescent light of the light emitting unit 15 and the light emitted from the phosphor particles is used in the transparent resin. For example, a silicone resin, an acrylic resin, a fluid glass or the like is used in the transparent resin. The wavelength conversion layer 46 may be a stacked body of a plurality of phosphor layers with different peak wavelength of emitted light. The luminescent light of the light emitting unit 15 is, for example, ultraviolet light, violet light, or blue light, and the light emitted from the wavelength conversion layer 46 is, for example, yellow light, red light, or green light. The combined light of the light emitted from the wavelength conversion layer 46 and the luminescent light is, for example, substantially white light. The combined light may be, for example, yellow light, red light, green light, or blue light.

An insulating layer 16 is provided between the light emitting unit 15 and the sealing unit 44. The insulating layer 16 is provided, for example, covering the light emitting unit 15, except for the second major surface 10b that is covered by the wavelength conversion layer 46, the portion in contact with the first conductive pillar 41, and the portion in contact with the second conductive pillar 42. Thereby, the insulating layer 16 increases, for example, the insulation between the light emitting unit 15 and the sealing unit 44. The insulating layer 16 protects the light emitting unit 15 from, for example, impurities in the sealing unit 44, and the like.

Inorganic material such as, for example, $SiO_2$, SiN, phosphorous silicate glass (PSG), boron phosphorous silicate glass (BPSG), and the like is used in the insulating layer 16. Also, an organic material such as, for example, light sensitive polyimide, benzocyclobutene, and the like can be used as the insulating layer 16, or a stacked body of an inorganic film and an organic film can be used. The thickness of the insulating layer 16 is, for example, about 400 nm. To form the insulating layer 16, CVD, vapor deposition, or sputtering, and the like, can be used, for example.

The first terminal 51 is provided on the first conductive pillar 41 and the sealing unit 44. When projected onto a plane (the X-Y plane) parallel to the first major surface 10a, the first terminal 51 has a portion 51a (first overlapping portion) that overlaps with the light emitting unit 15, and a portion 51b (second overlapping portion) that does not overlap with the light emitting unit 15 but does overlap with the sealing unit 44. When viewed from the Z-axis direction, the portion 51b of the first terminal 51 extends on an outer side of the light emitting unit 15. In this example, when viewed from the Z-axis direction, the portion 51b of the first terminal 51 extends on the outer side of the wavelength conversion layer 46. The length (the amount of projection from the light emitting unit 15) of the portion 51b of the first terminal 51 along a direction perpendicular to the Z-axis direction (for example, the X-axis direction) is, for example, not less than 100 μm and not more than 500 μm. The first terminal 51 is electrically connected to the first conductive pillar 41. For example, the first terminal 51 is in contact with the end portion 41a of the first conductive pillar 41 and electrically continuous with the first conductive pillar 41.

The second terminal 52 is provided so as to be apart from the first terminal 51, on the second conductive pillar 42 and the sealing unit 44. When projected onto the X-Y plane, the second terminal 52 has a portion 52a (third overlapping portion) that overlaps with the light emitting unit 15, and a portion 52b (fourth overlapping portion) that does not overlap with the light emitting unit 15 but does overlap with the sealing unit 44. When viewed from the Z-axis direction, the portion 52b of the second terminal 52 extends on the outer side of the light emitting unit 15. In this example, when viewed from the Z-axis direction, the portion 52b of the second terminal 52 extends on the outer side of the wavelength conversion layer 46. The length of the portion 52b of the second terminal 52 along a direction perpendicular to the Z-axis direction is, for example, not less than 100 μm and not more than 500 μm. The second terminal 52 is electrically connected to the second conductive pillar 42. For example, the second terminal 52 is in contact with the end portion 42a of the second conductive pillar 42 and electrically continuous with the second conductive pillar 42.

The first terminal 51 and the second terminal 52 are used, for example, for electrically connecting the semiconductor light emitting device 110 with external devices. In this example, the first terminal 51 is an n-side cathode, and the second terminal 52 is a p-side anode. When the semiconductor light emitting device 110 is used, a voltage is applied between the first terminal 51 and the second terminal 52, so that the first terminal 51 is negative and the second terminal 52 is positive. As a result, a voltage in the forward direction is applied to the light emitting unit 15, and light is emitted from the light emitting layer 30. A material having electrical conductivity such as, for example, a metal material or the like is used in the first terminal 51 and the second terminal 52. The first terminal 51 and the second terminal 52 may have, for example, a single layer structure using a single material, or a stacked structure using a plurality of materials.

In the semiconductor light emitting device 110, the second major surface 10b of the first semiconductor layer 10 is a light extraction surface. In other words, in this example, light emitted from the light emitting layer 30 is emitted to the outside of the semiconductor light emitting device 110 from the second major surface 10b. For example, minute irregularities may be formed on the second major surface 10b by performing a frosting process on the second major surface 10b by a wet etching process, a dry etching process or the like. In this way, for example, total reflection of the light emitted from the light emitting layer 30 at the second major surface 10b is suppressed, and the light extraction efficiency of the semiconductor light emitting device 110 is increased.

In the semiconductor light emitting device 110, the first terminal 51 and the second terminal 52 have the portions 51b and 52b that are not overlapped with the light emitting unit 15 but are overlapped with the sealing unit 44. As a result, it is possible to, for example, increase the heat dissipation of the semiconductor light emitting device 110. Thereby, it is possible to suppress damage to the semiconductor light emitting device 110 caused by heat, for example. Also, it is possible, for example, to make the area of the first terminal 51 and the second terminal 52 be wider. As a result, it is possible, for example, to improve the mountability of the semiconductor light emitting device 110. Thereby, it is possible, for example, to suppress defective connections of the semiconductor light emitting device 110 with external devices. Therefore, with the semiconductor light emitting device 110 according to this embodiment, it is possible to improve the reliability.

Hereinafter, an example of a manufacturing method of the semiconductor light emitting device 110 will be described.

FIGS. 2A to 2C, 3A to 3C, and 4A to 4D are schematic cross-sectional views illustrating a manufacturing method for a semiconductor light emitting device according to the first embodiment.

Figure 2A:
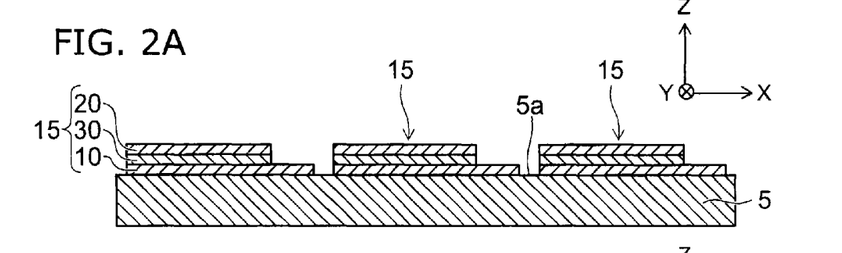
FIG. 2A to FIG. 2C are schematic cross-sectional views illustrating a manufacturing method for a semiconductor light emitting device according to the first embodiment.

As illustrated in FIG. 2A, a plurality of light emitting units 15 is formed on a surface 5a of a growth-use substrate 5, for example. To form the plurality of light emitting units 15, for example, a stacked body is formed by stacking a film that will become the first semiconductor layer 10, a film that will become the light emitting layer 30, and a film that will become the second semiconductor layer 20 in that order. A part of the stacked body is removed by, for example, a lithography process and an etching process. In this way, the plurality of light emitting units 15 is formed on the surface 5a.

A semiconductor substrate, for example, is used for the growth-use substrate 5. The semiconductor substrate may be n-type, p-type, or it may be undoped. If undoped, for example, an intrinsic semiconductor with {111} planes is used in the semiconductor substrate. An undoped semiconductor substrate may be doped to become p-type or n-type. In this example, a silicon substrate is used, for example, in the growth-use substrate 5. The growth-use substrate 5 may be, for example, a glass substrate such as sapphire glass or the like. To form the stacked body, for example, metal organic chemical vapor deposition (MOCVD) is used. For example, a crystal layer that includes a nitride semiconductor is epitaxially grown on the growth-use substrate 5. For example, a buffer layer may be provided between the growth-use substrate 5 and the film that will become the first semiconductor layer 10. The buffer layer has the function of lattice matching with the growth-use substrate 5 and the stress relief.

Figure 2B:
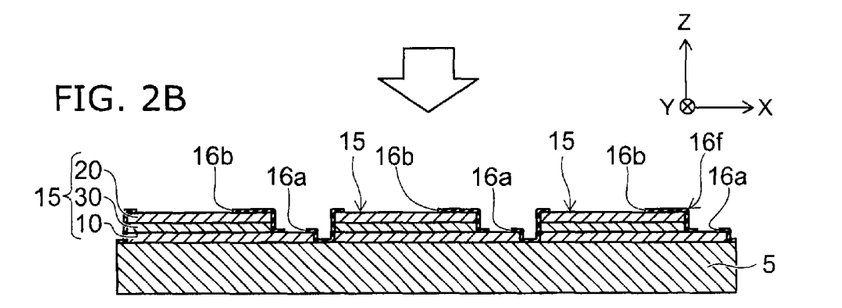

As illustrated in FIG. 2B, an insulating film 16f that will form the insulating layer 16 is formed on the surface 5a of the growth-use substrate 5 and the plurality of light emitting units 15 by, for example, a film forming process, a lithography process, and an etching process. The insulating film 16f is provided with a plurality of apertures 16a that allows a part of the first semiconductor layer 10 to be exposed, and a plurality of apertures 16b that allows a part of the second semiconductor layer 20 to be exposed. The apertures 16a are used to electrically connect the first semiconductor layer 10 and the first conductive pillar 41. The apertures 16b are used to electrically connect the second semiconductor layer 20 and the second conductive pillar 42.

Figure 2C:
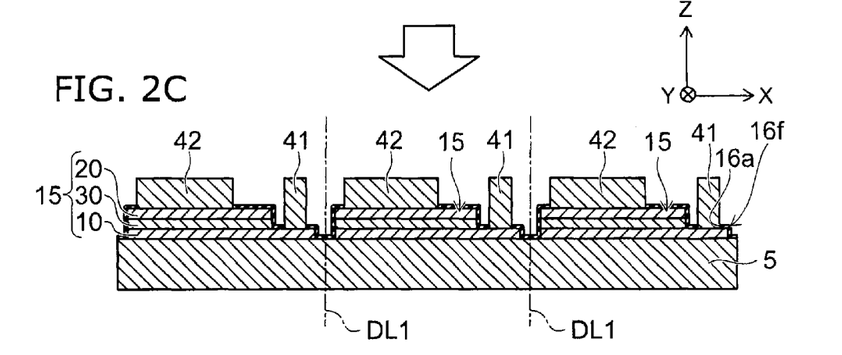

As illustrated in FIG. 2C, the first conductive pillar 41 is formed on each first semiconductor layer 10 of the plurality of light emitting units 15, and the second conductive pillar 42 is formed on each second semiconductor layer 20 of the plurality of light emitting units 15, by performing, for example, a film forming process, a lithography process, an etching process, a process of embedding a conductive material, and the like. The first conductive pillar 41 and the second conductive pillar 42 may be formed at the same time, or they may be formed separately.

For example, the first conductive pillar 41 and the second conductive pillar 42 may be contacted and made electrically continuous with a probe, and the peak wavelength of the luminescent light of each of the plurality of light emitting units 15 that is formed on the growth-use substrate 5 measured from the light emitted from the light emitting units 15. The peak wavelengths of the luminescent light of the plurality of light emitting units 15 are not necessarily uniform. For example, if the growth-use substrate 5 is a circular plate shaped semiconductor wafer, the peak wavelength of the light emitting units 15 located close to the center of the wafer is short, and the peak wavelength becomes gradually longer towards the periphery of the wafer, exhibiting a concentric circular distribution.

If the distribution of the peak wavelengths of the luminescent light of the plurality of light emitting units 15 is known in advance, measurement of the peak wavelengths may be omitted. The distribution of peak wavelengths of the luminescent light of the plurality of light emitting units 15 can be obtained empirically, for example, by repeatedly manufacturing the same type of semiconductor light emitting device 110. For example, it can be obtained by simulation. For example, it can be obtained in advance by optical measurement by the photoluminescence (PL) method.

Figure 3A:
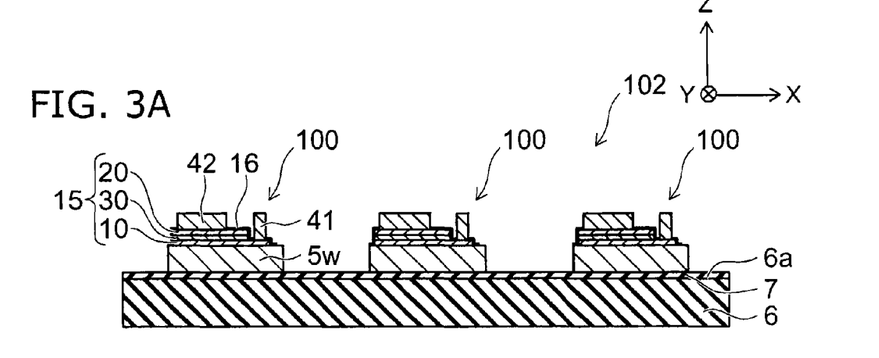
FIG. 3A to FIG. 3C are schematic cross-sectional views illustrating a manufacturing method for a semiconductor light emitting device according to the first embodiment.
Figure 3B:
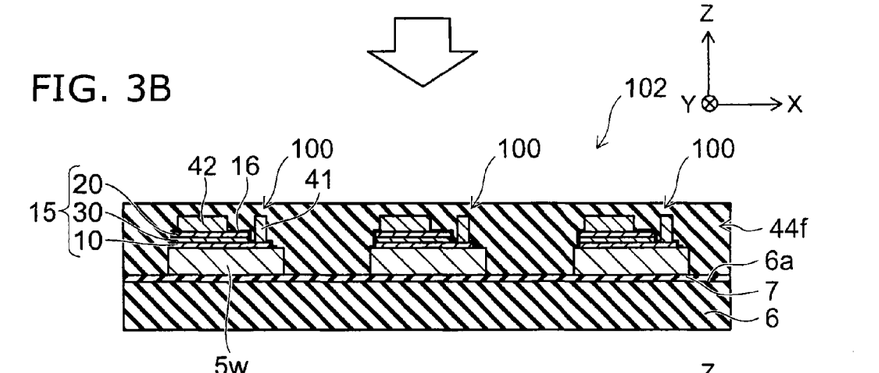
Figure 3C:
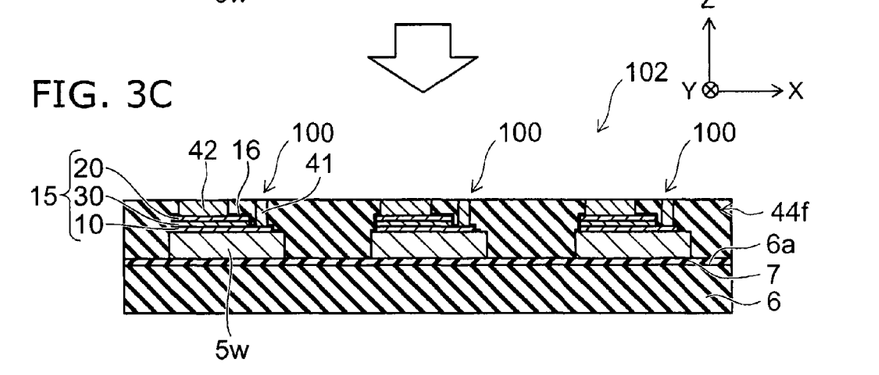

By cutting the growth-use substrate 5 along a first dicing line DL1, and dividing the growth-use substrate 5 into each of the plurality of light emitting units 15, a plurality of semiconductor components 100 of each of the plurality of light emitting units 15 is formed (see FIG. 3A to FIG. 3C).

In the semiconductor component 100, the insulating layer 16 is formed from the insulating film 16f. Also, in the semiconductor component 100, a substrate unit 5w is formed from the growth-use substrate 5. The semiconductor component 100 includes the substrate unit 5w, the light emitting unit 15, the first conductive pillar 41, and the second conductive pillar 42. The light emitting unit 15 is provided on the substrate unit 5w. The light emitting unit 15 includes the first semiconductor layer 10, the light emitting layer 30, and the second semiconductor layer 20. The first semiconductor layer 10 is provided on the substrate unit 5w, and has the first major surface 10a that includes the first portion 10p and the second portion 10q, and has the first conductivity type. The light emitting layer 30 is provided on the first portion 10p. The second semiconductor layer 20 is provided on the light emitting layer 30, and has the second conductivity type. The first conductive pillar 41 is provided on the second portion 10q, extends along the first direction perpendicular to the first major surface 10a, and is electrically connected to the first semiconductor layer 10. The second conductive pillar 42 is provided on the second semiconductor layer 20, extends along the first direction, and is electrically connected to the second semiconductor layer 20.

The plurality of semiconductor components 100 is divided into groups of each peak wavelength of the luminescent light of the light emitting units 15, for example. The range of peak wavelength (the difference between the maximum value and the minimum value) in one group is, for example, not more than 2 nm. The data on peak wavelength of the luminescent light used for dividing into groups may be data obtained by measurement, data obtained empirically, data obtained by simulation, or data obtained by optical measurement using the PL method.

As illustrated in FIG. 3A, a pressure sensitive adhesion layer 7 is formed on a surface 6a of a support substrate 6.

The plurality of semiconductor components 100 is arranged on the pressure sensitive adhesion layer 7, and fixed to the surface 6a of the support substrate 6 using the pressure sensitive adhesion layer 7. In this way, a work piece 102 is formed. Thereby, the work piece 102 is prepared.

A silicon wafer, a glass substrate, a quartz substrate, a ceramic substrate, or a polytetrafluoroethylene substrate or the like, for example, is used as the support substrate 6. An arbitrary material that can withstand, for example, degeneration, decomposition, warping, and the like due to the curing temperature of the resin for forming the sealing unit 44 may be used in the support substrate 6. The shape of the support substrate 6 when viewed in the Z-axis direction may be a circular shape or may be a polygonal shape. A pressure sensitive adhesive or a pressure sensitive sheet that includes a pressure sensitive adhesive, for example, may be used in the pressure sensitive adhesion layer 7. The pressure sensitive adhesion layer 7 is formed, for example, by applying pressure sensitive adhesive, or laying a pressure sensitive sheet. The spin coating method, a printing method, or the like, for example, is used for applying the pressure sensitive adhesive. The roller lamination method or the like, for example, is used to lay the pressure sensitive sheet. An acrylic pressure sensitive adhesive, a rubber pressure sensitive adhesive, or the like, for example, is used as the pressure sensitive adhesive.

The plurality of semiconductor components 100 is arranged on the surface 6a of the support substrate 6 in accordance with the peak wavelength of the light emitted from the light emitting units 15. For example, a plurality of semiconductor components 100 belonging to a single group is bonded to the support substrate 6. In other words, semiconductor components 100 whose peak wavelengths of luminescent light are close are bonded to the support substrate 6. The semiconductor components 100 of a single group bonded to the support substrate 6 may be, for example, semiconductor components 100 formed from a single growth-use substrate 5, or may be semiconductor components 100 formed from a plurality of growth-use substrates 5. Semiconductor components 100 from a plurality of groups may, for example, be bonded to the support substrate divided into each area.

As illustrated in FIG. 3B, a resin film 44f that will become the sealing unit 44 is formed on each of the plurality of semiconductor components 100 and on the surface 6a of the support substrate 6 (on the pressure sensitive adhesion layer 7). The resin film 44f covers the side face 15s of the light emitting unit 15, the side face 41s of the first conductive pillar 41, and the side face 42s of the second conductive pillar 42 of each of the plurality of semiconductor components 100. In this example, the resin film 44f also covers the end portion 41a of the first conductive pillar 41, and the end portion 42a of the second conductive pillar 42 of each of the plurality of semiconductor components 100. To form the resin film 44f, for example, the application method is used.

For example, after the resin film 44f has been applied, the resin film 44f is cured.

As illustrated in FIG. 3C, the end portion 41a of the first conductive pillar 41 and the end portion 42a of the second conductive pillar 42 are exposed by, for example, grinding away a part of the resin film 44f, by a grinding process, wet etching, dry etching, or the like.

Figure 4A:
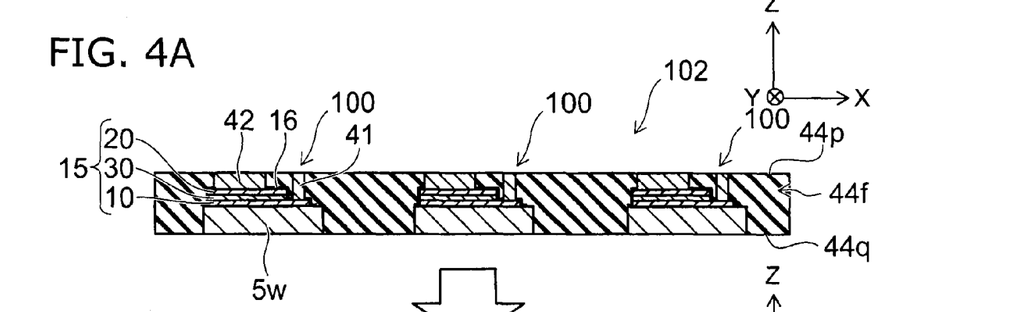
FIG. 4A to FIG. 4D are schematic cross-sectional views illustrating a manufacturing method for a semiconductor light emitting device according to the first embodiment.

As illustrated in FIG. 4A, the support substrate 6 is removed from the plurality of semiconductor components 100 and the resin film 44f, for example. The support substrate 6 is removed by, for example, reducing the adhesive force of the pressure sensitive adhesion layer 7. The adhesive force of the pressure sensitive adhesion layer 7 is reduced by, for example, irradiating the pressure sensitive adhesion layer 7 from the support substrate 6 side with ultraviolet light, or by heating the work piece 102.

Figure 4B:
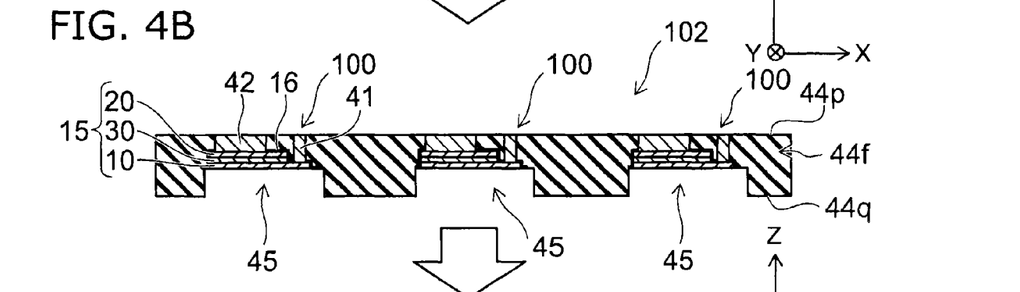

As illustrated in FIG. 4B, each substrate unit 5w is removed from the plurality of semiconductor components 100 by, for example, etching or the like. In this way, a plurality of concave portions 45 that reflect the shape of the substrate units 5w is formed on a first surface 44q of the resin film 44f.

Figure 4C:
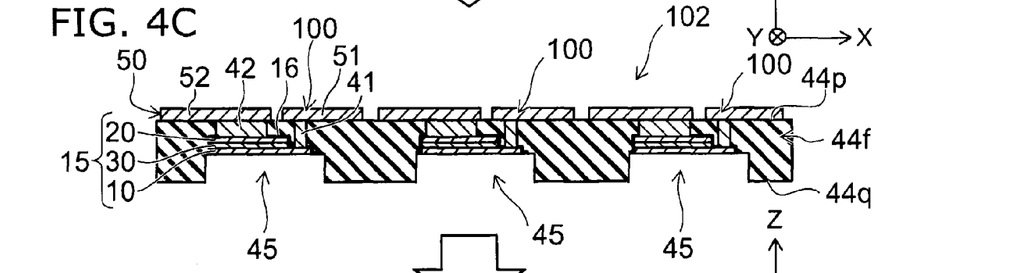

As illustrated in FIG. 4C, on a second surface 44p of the resin film 44f, conductive film 50 that will become the first terminal 51 and the second terminal 52 is formed. For example, by patterning the conductive film 50 by, for example, a lithography process and an etching process, the first terminal 51 and the second terminal 52 are formed from the conductive film 50. At that time, the first terminal 51 is provided on the first conductive pillar 41 and on the resin film 44f. The second terminal 52 is provided on the second conductive pillar 42 and on the resin film 44f.

Figure 4D:
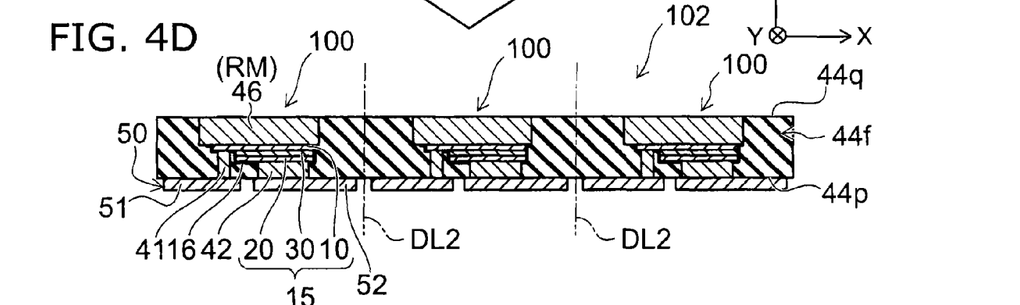

As illustrated in FIG. 4D, each of the plurality of concave portions 45 is filled with, for example, a resin material RM that will become the wavelength conversion layer 46 (resin material RM that includes a wavelength conversion material). In this way, each of the wavelength conversion layers 46 of the plurality of semiconductor components 100 is formed. For example, each of the plurality of concave portions 45 is filled with a liquid transparent resin in which phosphor particles are dispersed. In this way, a phosphor layer is formed as the wavelength conversion layer 46. In this example, the wavelength conversion material is, for example, phosphor particles. The resin film 44f is cut along second dicing lines DL2. In other words, the resin film 44f is cut between the plurality of semiconductor components 100. In this way, the plurality of semiconductor components 100 is separated. The first terminal 51 and the second terminal 52 may also be formed by cutting the conductive film 50, when the plurality of semiconductor components 100 is separated by dicing, for example.

Thereby, a semiconductor light emitting device 110 is completed.

In this example, the plurality of semiconductor components 100 is rearranged on the surface 6a of the support substrate 6 in accordance with the peak wavelength of the light emitted from the light emitting units 15. In this way, it is possible to, for example, make the chromaticity of the plurality of semiconductor light emitting devices 110 uniform. In this way, in addition to the reliability regarding heating and the reliability regarding mounting of the semiconductor light emitting device 110, for example, it is possible to improve the reliability regarding the luminescent color of the semiconductor light emitting device 110.

For example, after the support substrate 6 has been removed (FIG. 4A), the first surface 44q of the resin film 44f and a part of each of the substrate units 5w of the plurality of semiconductor components 100 are ground by a grinding process, wet etching, dry etching, or the like, and the thicknesses of the resin film 44f and the plurality of substrate units 5w are adjusted. In other words, by adjusting the depth of the concave portions 45, the thickness of the wavelength conversion layer 46 is adjusted. For example, the thickness of the wavelength conversion layer 46 is changed in accordance with the peak wavelength of the luminescent light of the light emitting unit 15. In this way, it is possible to make the chromaticity of the semiconductor light emitting devices 110 uniform. For example, the chromaticity of the semiconductor light emitting devices 110 may be made uniform by changing the composition of the wavelength conversion layer 46 in accordance with the peak wavelength of the luminescent light of the light emitting units 15.

Figure 5:
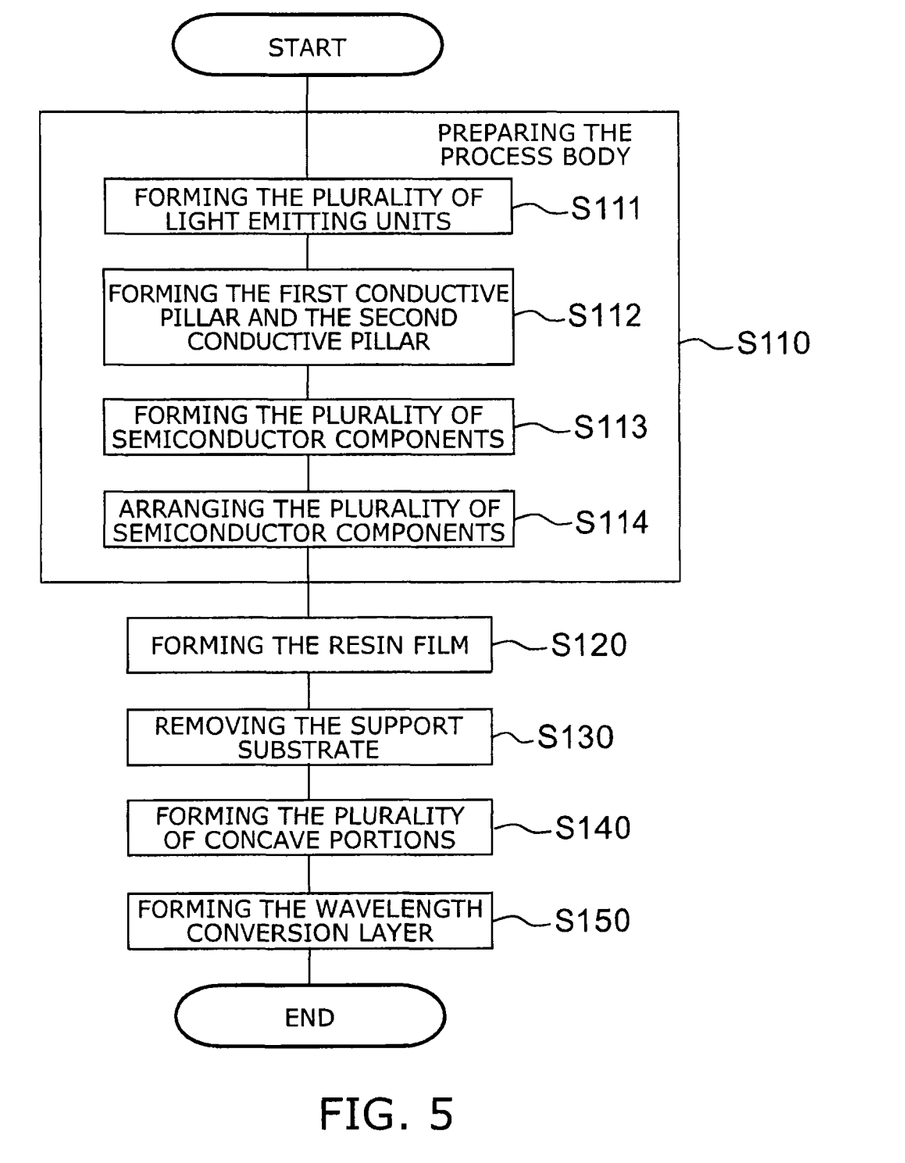
FIG. 5 is a flowchart illustrating the method for manufacturing a semiconductor light emitting device according to the first embodiment.

FIG. 5 is a flowchart illustrating the method for manufacturing a semiconductor light emitting device according to the first embodiment.

As illustrated in FIG. 5, this manufacturing method includes a step S110 of preparing the work piece 102; a step S120 of forming the resin film 44f; a step S130 of removing the support substrate 6; a step S140 of forming the plurality of concave portions 45; and a step S150 of forming the wavelength conversion layer 46.

The step S110 of preparing the work piece 102 includes, for example, a step S111 of forming the plurality of light emitting units 15; a step S112 of forming the first conductive pillar 41 and the second conductive pillar 42; a step S113 of forming the plurality of semiconductor components 100; and a step S114 of arranging the plurality of semiconductor components 100 on the support substrate 6.

Preparing the work piece 102 includes, for example, forming the plurality of semiconductor components 100, and arranging each of the semiconductor components 100 on the support substrate 6 to form the work piece 102. Preparing the work piece 102 includes, for example, putting the work piece 102 that has been formed into the state in which it can be used in the manufacture of the semiconductor light emitting device 110. The state in which it can be used includes, for example, removing a protective film that covers and protects the work piece 102, and setting the work piece 102 in a manufacturing device.

In step S110, for example, the processing described in relation to FIG. 2A through FIG. 2C is performed. In step S120, for example, the processing described in relation to FIG. 3B is performed. In step S130, for example, the processing described in relation to FIG. 4A is performed. In step S140, for example, the processing described in relation to FIG. 4B is performed. In step S150, for example, the processing described in relation to FIG. 4D is performed.

In this way, the semiconductor light emitting device 110 with high reliability is manufactured.

Second Embodiment

Figure 6A:
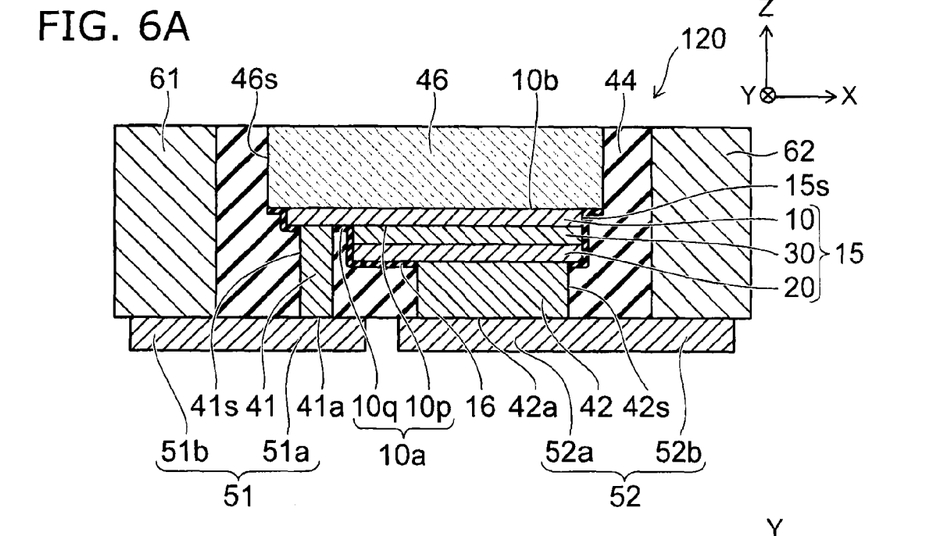
FIG. 6A and FIG. 6B are schematic views illustrating a semiconductor light emitting device according to a second embodiment.
Figure 6B:
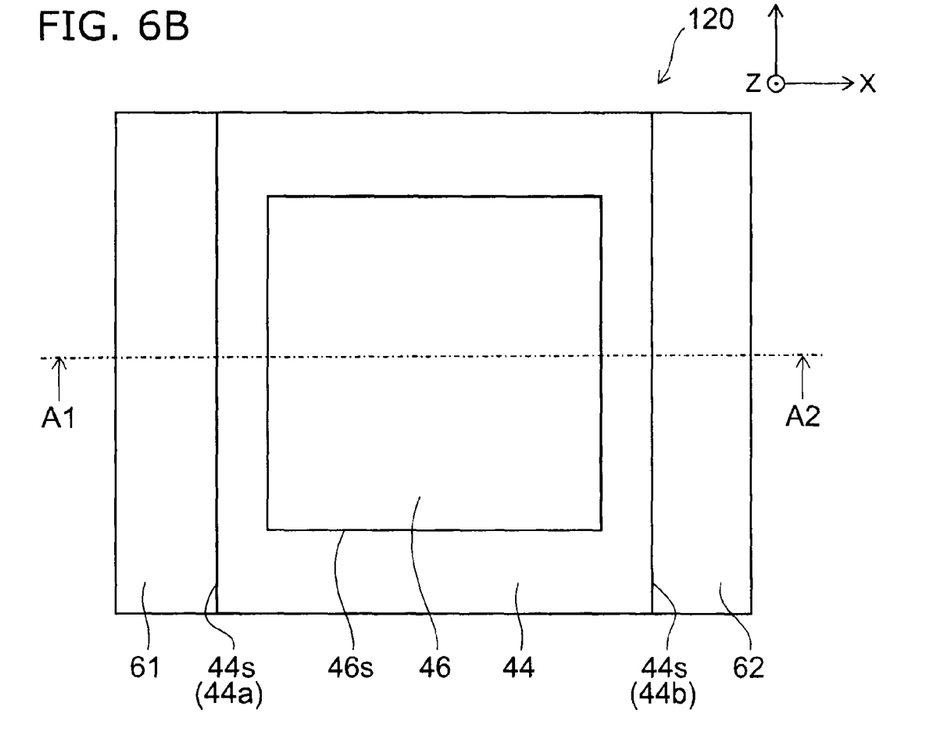

FIG. 6A and FIG. 6B are schematic views illustrating a semiconductor light emitting device according to a second embodiment.

FIG. 6A is a schematic cross-sectional view. FIG. 6B is a schematic plan view. FIG. 6A schematically illustrates the cross-section at the line A1-A2 in FIG. 6B.

As illustrated in FIG. 6A and FIG. 6B, a semiconductor light emitting device 120 further includes a first metal edge portion 61 and a second metal edge portion 62.

The sealing unit 44 has a side face 44s along the Z-axis direction. The side face 44s includes a first side face 44a, and a second side face 44b that is different from the first side face 44a.

The first metal edge portion 61 covers the first side face 44a. The first metal edge portion 61 is electrically connected to the first terminal 51. The first metal edge portion 61 is in contact with a portion 51b of the first terminal 51. The second metal edge portion 62 is provided so as to be apart from the first metal edge portion 61. The second metal edge portion 62 covers the second side face 44b. The second metal edge portion 62 is, for example, opposed to the first metal edge portion 61 in the X-axis direction (the opposing direction). The second metal edge portion 62 is electrically connected to the second terminal 52. The second metal edge portion 62 is in contact with the portion 52b of the second terminal 52. For example, copper, aluminum or the like is used in the first metal edge portion 61 and the second metal edge portion 62.

In the semiconductor light emitting device 120, heat dissipation can be further increased by the first metal edge portion 61 and the second metal edge portion 62, for example. Also, for example, a part of the solder that is applied to the first terminal 51 and the second terminal 52 rises up to the first metal edge portion 61 and the second metal edge portion 62, so it is possible to further improve the mountability. Therefore, in the semiconductor light emitting device 120, it is possible to further increase the reliability.

Also, in the semiconductor light emitting device 120, it is possible to adjust the orientation of the luminescent light using the first metal edge portion 61 and the second metal edge portion 62. At this time, the shape, size, and thickness of the first metal edge portion 61 and the second metal edge portion 62 may be designed from this viewpoint. For example, it is possible to adjust the orientation of the luminescent light by varying the distance between the first metal edge portion 61 and the side face 46s of the wavelength conversion layer 46, or the distance between the second metal edge portion 62 and the side face 46s of the wavelength conversion layer 46.

Figure 7A:
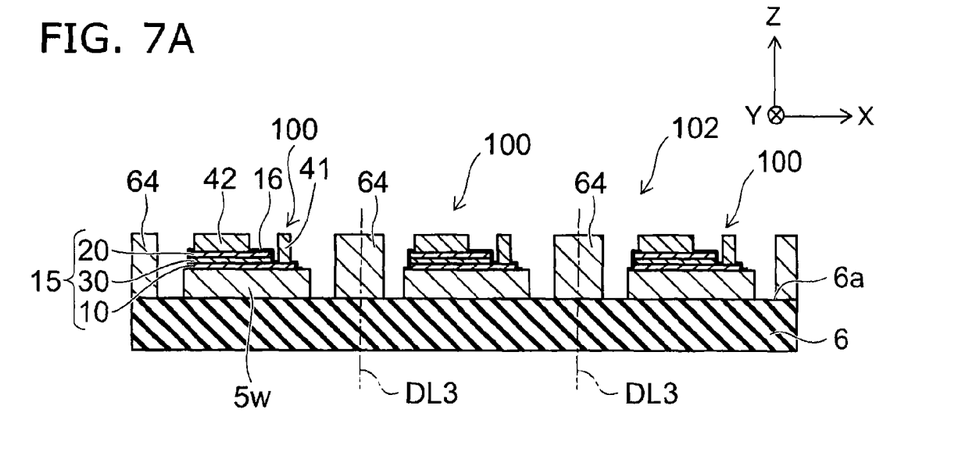
FIG. 7A and FIG. 7B are schematic views illustrating the method for manufacturing a semiconductor light emitting device according to the second embodiment.
Figure 7B:
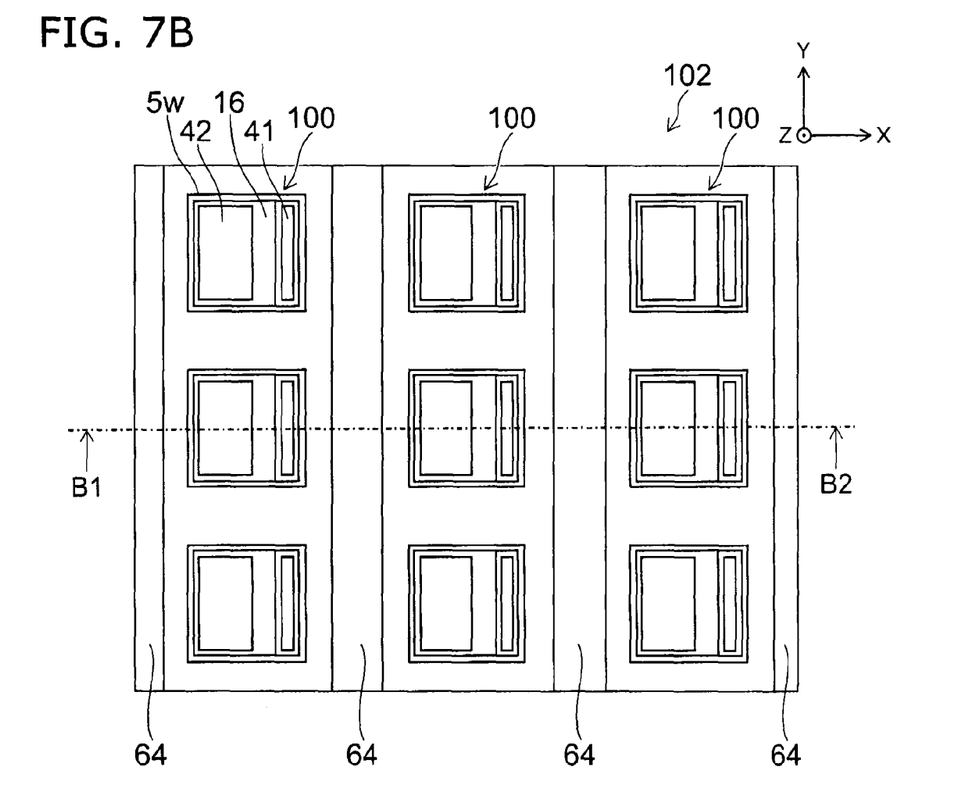

FIG. 7A and FIG. 7B are schematic views illustrating the method for manufacturing a semiconductor light emitting device according to the second embodiment.

FIG. 7A is a schematic cross-sectional view. FIG. 7B is a schematic plan view. FIG. 7A schematically illustrates the cross-section at the line B1-B2 in FIG. 7B.

As illustrated in FIG. 7A and FIG. 7B, when manufacturing the semiconductor light emitting device 120, for example, a plurality of metal frames 64 is provided on the work piece 102. In this example, each of the plurality of metal frames 64 extends along the Y-axis direction. Each of the plurality of metal frames 64 is provided between the pairs of semiconductor components 100 that are closest in the X-axis direction, for example. Each of the plurality of metal frames 64 is provided on the surface 6a of the support substrate 6 before forming the resin film 44f.

For example, the plurality of semiconductor components 100 is arranged on the surface 6a of the support substrate 6, and the plurality of metal frames 64 is provided on the surface 6a. Thereafter, the resin film 44f is formed, the support substrate 6 is removed, the plurality of concave portions 45 is formed, the conductive film 50 is formed, and the wavelength conversion layer 46 is formed, the same as for the semiconductor light emitting device 110. Then, for example, dicing is performed along third dicing lines DL3 that are set within the metal frames 64 in the X-axis direction, and the resin film 44f and the plurality of metal frames 64 is divided into each of the plurality of semiconductor components 100. In this way, one part of the divided metal frame 64 becomes the first metal edge portion 61, and the other becomes the second metal edge portion 62, and the semiconductor light emitting device 120 is completed.

Third Embodiment

Figure 8A:
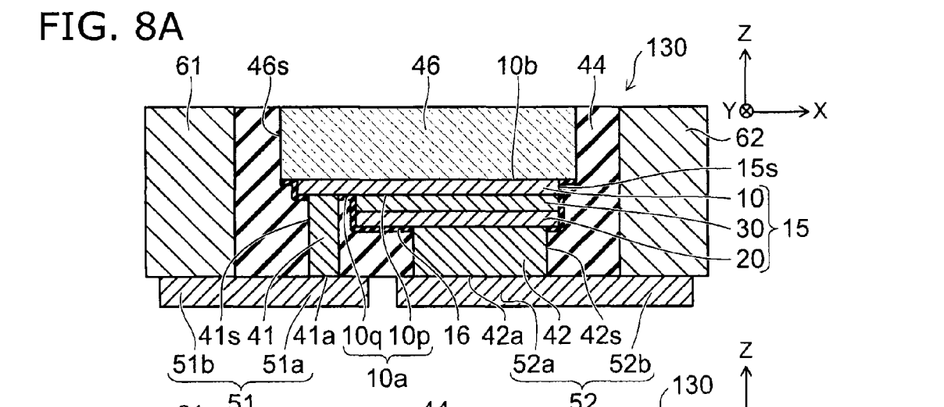
FIG. 8A to FIG. 8C are schematic views illustrating a semiconductor light emitting device according to a third embodiment.
Figure 8B:
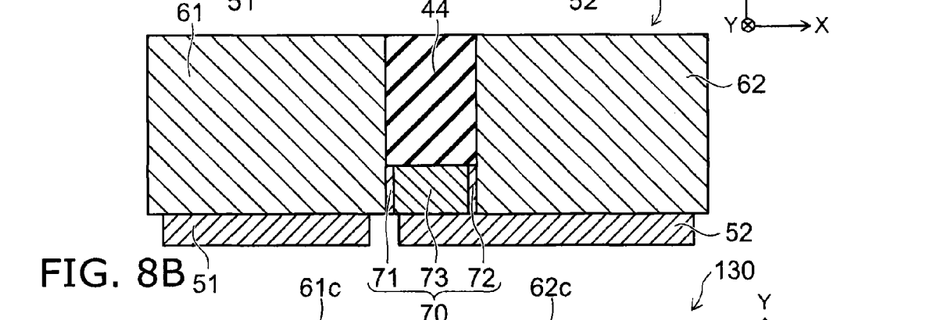
Figure 8C:
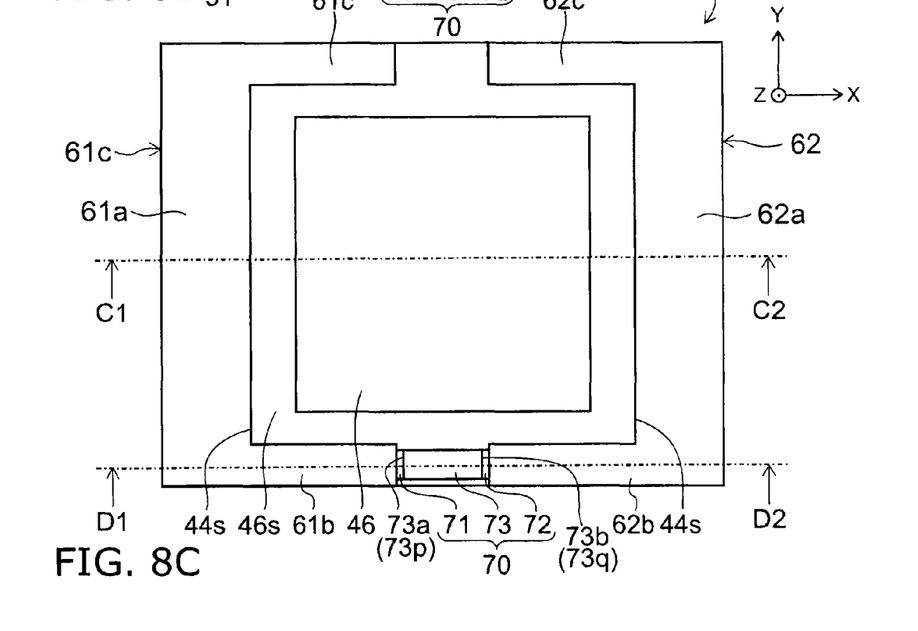

FIG. 8A to FIG. 8C are schematic views illustrating a semiconductor light emitting device according to a third embodiment.

FIG. 8A and FIG. 8B are schematic cross-sectional views. FIG. 8C is a schematic plan view. FIG. 8A schematically illustrates the cross-section at the line C1-C2 in FIG. 8C. FIG. 8B schematically illustrates the cross-section at the line D1-D2 in FIG. 8C.

As illustrated in FIG. 8A through FIG. 8C, a semiconductor light emitting device 130 further includes a rectification element 70.

The rectification element 70 includes a first electrode 71, a second electrode 72, and a rectification unit 73.

One edge 73a of the rectification unit 73 is electrically connected to the first terminal 51. One other edge 73b of the rectification unit 73 is electrically connected to the second terminal 52. The rectification unit 73 outputs a current in one direction (for example, the forward direction) between the first electrode 71 (one edge 71a) and the second electrode 72 (other edge 73b). The rectification unit 73 facilitates current flow in one direction between the first electrode 71 and the second electrode 72, and hinders current flow in the other direction (for example, the reverse direction) between the first electrode 71 and the second electrode 72. For example, the resistance in the forward direction (first rectification direction) between the one edge 73a and the other edge 73b is less than the resistance in the reverse direction (second rectification direction) between the one edge 71a and the other edge 73. For example, in the rectification unit 73, current does not flow in the reverse direction. Also, in the rectification unit 73, current that flows in the reverse direction is less than current that flows in the forward direction. In this example, current flows, for example, in the direction from the first electrode 71 to the second electrode 72.

The first electrode 71 is electrically connected to the first metal edge portion 61. In this way, the first electrode 71 is electrically connected to the first semiconductor layer 10 via the first metal edge portion 61, the first terminal 51, and the first conductive pillar 41. The second electrode 72 is electrically connected to the second metal edge portion 62. In this way, the second electrode 72 is electrically connected to the second semiconductor layer 20 via the second metal edge portion 62, the second terminal 52, and the second conductive pillar 42.

The first metal edge portion 61 includes a first main body part 61a (first extending part) that extends along the Y-axis direction (extension direction), a first projection 61b (second extending part) that extends along the X-axis direction from one end of the first main body part 61a towards the second metal edge portion 62, and a second projection 61c that extends along the X-axis direction from another end of the first main body part 61a towards the second metal edge portion 62.

The second metal edge portion 62 includes a second main body part 62a (third extending part) that extends along the Y-axis direction, a third projection 62b (fourth extending part) that extends along the X-axis direction from one end of the second main body part 62a towards the first metal edge portion 61 and that is opposed to the first projection 61b, and a fourth projection 62c that extends along the X-axis direction from another end of the second main body part 62a towards the first metal edge portion 61 and that is opposed to the second projection 61c. A predetermined gap is provided between the first projection 61b and the third projection 62b. A predetermined gap is provided between the second projection 61c and the fourth projection 62c.

The rectification unit 73 is, for example, a cuboid shape. The first electrode 71 is provided on one face 73p of the rectification unit 73. The second electrode 72 is provided on the face 73q of the rectification unit 73 that is on the opposite side to the first electrode 71. The distance between an edge of the first electrode 71 and an edge of the second electrode 72 is substantially the same as the distance of the gap between the first projection 61b and the third projection 62b. The rectification element 70 is disposed, for example, between an edge of the first projection 61b and an edge of the third projection 62b. The rectification element 70 is fitted, for example, between an edge of the first projection 61b and an edge of the third projection 62b. The first projection 61b is in contact with the first electrode 71 of the rectification element 70, for example, so the first electrode 71 is electrically connected to the first metal edge portion 61. The third projection 62b is in contact with the second electrode 72 of the rectification element 70, for example, so the second electrode 72 is electrically connected to the second metal edge portion 62. The rectification element 70 may be provided between the second projection 61c and the fourth projection 62c. Also, the rectification element 70 is covered and retained by, for example, the sealing unit 44. The first electrode 71 and the second electrode 72 are covered by, for example, the sealing unit 44. In this way, the exposure of the first electrode 71 and the second electrode 72 to the outside is suppressed.

Figure 9:
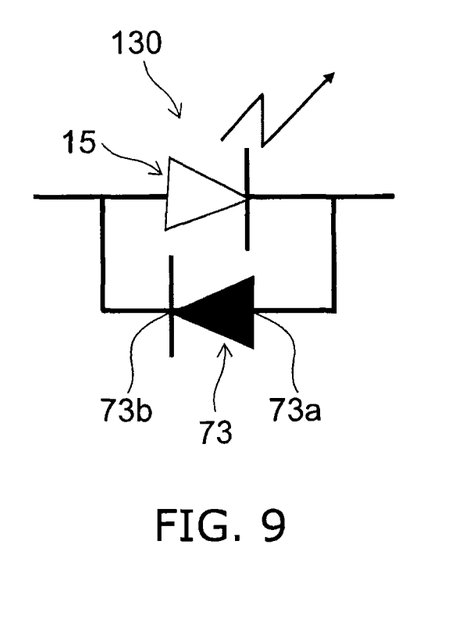
FIG. 9 is an equivalent circuit diagram illustrating a semiconductor light emitting device according to the third embodiment.

FIG. 9 is an equivalent circuit diagram illustrating a semiconductor light emitting device according to the third embodiment.

As illustrated in FIG. 9, the light emitting unit 15 is, for example, a light emitting diode. The rectification unit 73 is a diode, for example. In the semiconductor light emitting device 130, the rectification unit 73 is electrically connected as described above, and is connected in parallel to the light emitting unit 15 in the reverse direction.

The forward voltage drop of the rectification unit 73 is, for example, less than the maximum allowable reverse voltage (hereafter referred to as the reverse withstand voltage) of the light emitting unit 15. Also, the reverse withstand voltage of the rectification unit 73 is greater than the forward voltage applied to the light emitting unit 15 during operation.

The rectification unit 73 conducts current when an excessive voltage (a voltage that exceeds the reverse withstand voltage of the light emitting unit 15) is applied in the reverse direction to the semiconductor light emitting device 130 due to electrostatic discharge (ESD) or the like. When the rectification unit 73 conducts, the maximum value of the voltage in the reverse direction applied to the light emitting unit 15 reduces to the forward direction voltage of the rectification unit 73. In this way, in the semiconductor light emitting device 130, the light emitting unit 15 is protected from excessive voltages in the reverse direction. Therefore, in the semiconductor light emitting device 130, the reliability can be further increased.

The rectification unit 73 may be, for example, a Zener diode. In this way, for example, it is possible to protect the light emitting unit 15 from excessive voltages in the forward direction, as well as from excessive voltages in the reverse direction. In this example, the first metal edge portion 61 and the second metal edge portion 62 were used as the wiring for the light emitting unit 15 and the rectification unit 73, but the method of wiring the light emitting unit 15 and the rectification unit 73 is not limited to this, and any method may be used.

According to this embodiment, a highly reliable semiconductor light emitting device and method for manufacturing the same can be provided.

Note that in this specification, the term, "nitride semiconductor" includes semiconductors of all compositions wherein composition proportions of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Embodiments of the invention with reference to examples were described above. However, the embodiments of the invention are not limited to these examples. For example, if a person with ordinary skill in the art to which the invention pertains selects as appropriate each element from the publicly-known range for the specific configuration of the first semiconductor layers, the second semiconductor layers, the light emitting layers, the light emitting units, the first conductive pillars, the second conductive pillars, the sealing units, the first terminals, the second terminals, the first metal edge portions, the second metal edge portions, the rectification units, the rectification elements, the support substrates, the semiconductor components, the process bodies, the resin films, the wavelength conversion layers, the growth-use substrates, and the like, that are included in the semiconductor light emitting device, and implements the invention in the same way, it is included within the invention as long as the same effect can be obtained.

Further, any two or more components of the specific examples may be combined within the extent of technical feasibility and are included in the scope of the invention to the extent that the purport of the invention is included.

Moreover, all semiconductor light emitting devices and methods for manufacturing the same practicable by an appropriate design modification by one skilled in the art based on the semiconductor light emitting devices and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
a light emitting unit including a first semiconductor layer, a light emitting layer, and a second semiconductor layer, the first semiconductor layer having a first conductivity type, and having a major surface including a first portion and a second portion, the light emitting layer provided on the first portion, the second semiconductor layer having a second conductivity type and provided on the light emitting layer, the light emitting unit having a side face intersecting with the major surface;
a first conductive pillar provided on the second portion and extending along a first direction perpendicular to the major surface, the first conductive pillar having a side face along the first direction and being electrically connected to the first semiconductor layer, the first conductive pillar having a first end portion, the first end portion being on a side opposite to the first semiconductor layer;
a second conductive pillar provided on the second semiconductor layer and extending along the first direction, the second conductive pillar having a side face along the first direction and being electrically connected to the second semiconductor layer, the second conductive pillar having a second end portion, the second end portion being on a side opposite to the second semiconductor layer;
a sealing unit covering the side face of the light emitting unit, the side face of the first conductive pillar, and the side face of the second conductive pillar;
a first terminal provided on the first end portion of the first conductive pillar and on the sealing unit, and being electrically connected to the first conductive pillar, the first terminal including a first overlapping portion and a second overlapping portion, the first overlapping portion overlapping with the light emitting unit, the second overlapping portion not overlapping with the light emitting unit and overlapping with the sealing unit when projected onto a plane parallel to the major surface, the first terminal having a surface facing an opposite side to the first conductive pillar, the first terminal having a side face intersecting with the surface, the surface and the side face of the first terminal being exposed, the surface and the side face of the first terminal being capable to contact with a solder;

a second terminal provided on the second end portion of the second conductive pillar and on the sealing unit, the second terminal being apart from the first terminal and being electrically connected to the second conductive pillar, the second terminal including a third overlapping portion overlapping with the light emitting unit and a fourth overlapping portion not overlapping with the light emitting unit and overlapping with the sealing unit when projected onto the plane, the second terminal having a surface facing an opposite side to the second conductive pillar, the second terminal having a side face intersecting with the surface, the surface and the side face of the second terminal being exposed, the surface and the side face of the second terminal being capable to contact with a solder; and a wavelength conversion layer having a side face intersecting with the major surface, the first semiconductor layer being provided on the wavelength conversion layer, the first terminal having a first length in a second direction perpendicular to the first direction, the second terminal having a second length in the second direction, the wavelength conversion layer having a third length in the second direction, and a total length of the first length and the second length being longer than the third length.

2. The device according to claim 1, further comprising
a first metal edge portion, and
a second metal edge portion being apart from the first metal edge portion,
the sealing unit has a side face along the first direction,
the side face of the sealing unit includes a first side face portion and a second side face portion being different from the first side face portion,
the first metal edge portion covers the first side face portion and is electrically connected to the first terminal, and
the second metal edge portion covers the second side face portion and is electrically connected to the second terminal.

3. The device according to claim 2, wherein
the first metal edge portion contacts the second overlapping portion, and
the second metal edge portion contacts the fourth overlapping portion.

4. The device according to claim 1, further comprising a rectification element including a rectification unit,
one end of the rectification unit is electrically connected to the first terminal, and
one other end of the rectification unit is electrically connected to the second terminal.

5. The device according to claim 4, wherein
the resistance in a first rectification direction between the one end and the one other end is less than the resistance in a second rectification direction opposing to the first rectification direction between the one end and the one other end,
the light emitting unit has a forward direction, and light is emitted from the light emitting layer in the forward direction,
the rectification unit is connected in parallel with the light emitting unit, and
the first rectification direction is the opposite to the forward direction.

6. The device according to claim 5, wherein a voltage drop of the rectification unit in the first rectification direction is less than an allowable voltage in the reverse direction of the light emitting unit.

7. The device according to claim 4, wherein the rectification element is covered by the sealing unit.

8. The device according to claim 1, further comprising a wavelength conversion layer having a side face intersecting with the major surface,
the first semiconductor layer is provided on the wavelength conversion layer, and
wherein the sealing unit also covers the side face of the wavelength conversion layer.

9. The device according to claim 1, further comprising an insulating layer provided between the light emitting unit and the sealing unit.

10. The device according to claim 1, wherein
the first terminal contacts the first conductive pillar, and
the second terminal contacts the second conductive pillar.

11. The device according to claim 1, wherein the total length is not less than 1 times and not more than 2 times of the third length.

* * * * *